United States Patent [19]

Grueter et al.

[11] Patent Number: 4,951,036
[45] Date of Patent: Aug. 21, 1990

[54] TOUCHPAD JOGGER

[75] Inventors: James R. Grueter, Grass Valley; Alethea F. Mackinnon, Nevada City, both of Calif.

[73] Assignee: The Grass Valley Group, Inc., Nevada City, Calif.

[21] Appl. No.: 228,094

[22] Filed: Aug. 4, 1988

[51] Int. Cl.$^5$ .............................................. G09G 3/02
[52] U.S. Cl. ................................... 340/712; 340/706; 340/710; 178/18; 200/5 A
[58] Field of Search ..................... 340/706, 709, 710; 341/20; 178/18, 19; 273/148 B; 200/5 A

[56] References Cited

U.S. PATENT DOCUMENTS

| | | | |
|---|---|---|---|
| 4,318,095 | 3/1982 | Fukuoka | 340/706 |
| 4,644,337 | 2/1987 | Shank et al. | 340/709 |
| 4,788,537 | 11/1988 | Potiker | 340/706 |
| 4,794,388 | 12/1988 | Matthews | 340/709 |
| 4,806,917 | 2/1989 | Hosogoe | 340/709 |
| 4,816,622 | 3/1989 | Holloway | 340/709 |

Primary Examiner—Alvin E. Oberley
Assistant Examiner—M. Fatahiyar
Attorney, Agent, or Firm—Francis I. Gray

[57] ABSTRACT

A touchpad jogger for emulating operator contact with a touchpad surface has a ball rotatably mounted at the end of a spring arm cantilever mounted to one end of an axle. A knob is fixedly mounted to the other end of the axle so that when the knob is rotated the ball is caused to roll across the touchpad surface to emulate operator contact. A plate through which the axle extends provides for attaching the touchpad jogger to a housing containing the touchpad surface.

8 Claims, 1 Drawing Sheet

TOUCHPAD JOGGER

BACKGROUND OF THE INVENTION

The present invention relates to rotational control devices, and more particularly to a touchpad jogger that provides an interface between an operator and a touchpad surface for providing control of video tape machines in a video editing suite.

In the video editing field an operator controls the movement of video tape past play/record heads either at a tape recorder machine or remotely from an editing console. This process of controllably moving the video tape is generally referred to as "jogging". At an editing console the operator in the past has had a knob coupled to a continuous potentiometer. As the knob is rotated the change in resistance in an electrical circuit of which the potentiometer is a part is converted into a variable movement control signal for the tape recorder machine. The direction of movement is determined by the increase or decrease of resistance, and the speed of movement is determined as a function of the rate of change of the resistance, i.e., the speed at which the potentiometer is rotated.

The mechanical potentiometer system was replaced with an electronic touchpad system without any moving parts. Now an operator moves a finger or stylus in a circle over the surface of the touchpad and the movement of the video tape is controlled according to the direction and speed of the circular contact, as in the mechanical situation. Alternatively linear contact by the operator across the touchpad surface, as disclosed in co-pending U.S. patent application Ser. No. 30,778 filed Mar. 25, 1987 by Rayner et al. entitled "Touch Pad Machine Control", may produce the same result. The contact point with the touchpad is converted into a series of (x,y) positions that are sampled and input to a microprocessor system for conversion into the movement control signals.

However some operators who were used to the mechanical potentiometer systems have found it difficult to convert to the touchpad system. Therefore what is desired is a means to emulate the movement and feed of the mechanical potentiometer system in the electronic touchpad system.

SUMMARY OF THE INVENTION

Accordingly the present invention provides a touchpad jogger for controllably moving video tape past record/playback heads of a tape recorder machine that emulates the movement and feel of prior mechanical potentiometer joggers. An essentially frictionless ball is rotatably mounted at the end of a spring arm which in turn is fixedly mounted to an axle. The axle is rotatably mounted in a cover located over a touchpad so that the ball contacts the touchpad. The end of the axle opposite the ball is fixedly held in a knob so that rotation of the knob causes the ball to move circularly on the touchpad, emulating operator contact with the touchpad to produce movement of the video tape.

The objects, advantages and other novel features of the present invention are apparent from the following detailed description when read in conjunction with the appended claims and attached drawing.

DESCRIPTION OF THE PREFERRED EMBODIMENT

Figure 1:
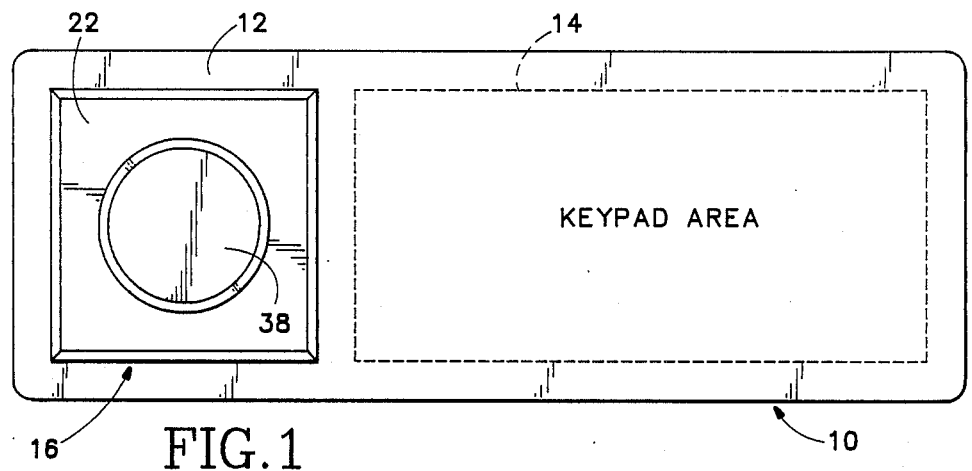
FIG. 1 is a top plan view of a control keyboard having a touchpad jogger according to the present invention.
Figure 2:
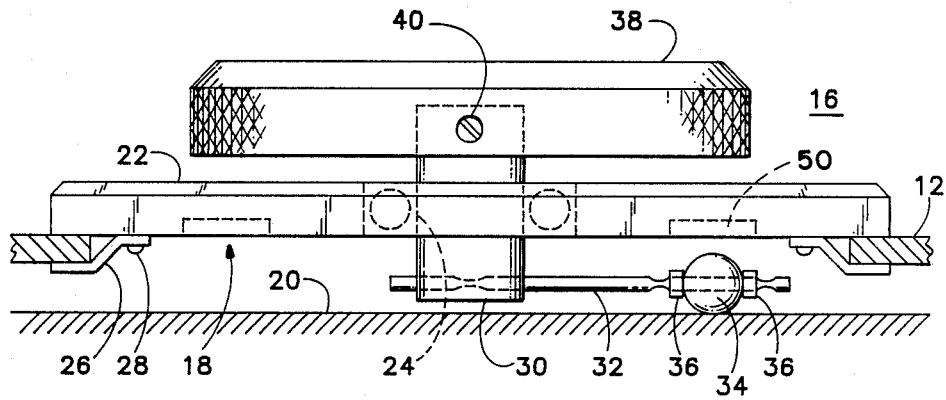
FIG. 2 is side plan view of the touchpad jogger according to the present invention.
Figure 3:
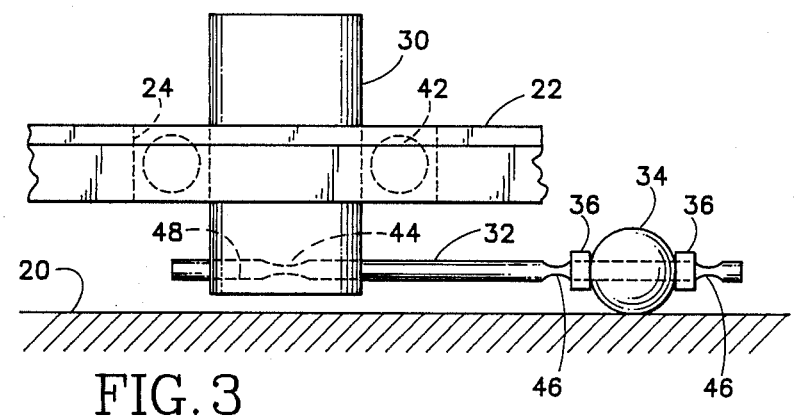
FIG. 3 is an expanded side plan view of the touchpad jogger of FIG. 2.

Referring now to FIGS. 1-3 a control keybroad 10 is shown having a cover 12 with a keypad area 14 and a touchpad jogger 16. Within the cover 12 is an opening 18 that exposes a touchpad surface 20. Over the opening 18 is mounted a cover plate 22 having a central opening 24. The cover plate 22 is mounted to the cover 12 either fixedly or detachably by any suitable means, such as by a mounting plate 26 and screw 28 combination as shown, by gluing, by riveting or the like. Within the central opening 24 is rotatably mounted an axle 30 having a portion extending on either side of the cover plate 22. At one end of the axle 30 between the cover plate 22 and the touchpad surface 20 is fixedly mounted an arm 32 extending from the axle approximately parallel to the touchpad surface. At one end of the arm 32 is mounted an essentially frictionless ball 34 that is free to rotate about the arm. On either side of the ball 34, mounted on the arm 32 so as to freely rotate about the arm, are a pair of spacers 36 to maintain the ball at a fixed position on the arm relative to the axle 30.

The arm 32 may be crimped, or staked, at one end 44 and crimped, or staked, at the other end 46 on either side of the ball 34. The one end 44 may be press fit into a hole 48 through the axle 30 and securely held in place by the staked portion. The spacers 36 serve to prevent the ball 34 from riding onto the staked portion 46 of the arm 32 and, thus, binding the ball to prevent rotation. If the spacers 36 bind on the staked portions 46, the ball 34 is still free to rotate.

Fixedly attached to the end of the axle 30 above the cover plate 22 is a knob 38. The knob 38 may be press fitted to the end of the axle 30 and/or held fixedly in place by set screws 40 or the like. Additionally to provide rotational freedom of the axle 30 within the cover plate 22 a cam race 42, press fit into the central opening 24, surrounds the axle. Also at the undersurface of the cover plate 22 facing the touchpad surface 20 is a groove or indentation 50 that extends in a circle centered about the central opening 24 at a diameter such that the groove or indentation is above the ball 34 to provide a greater range of vertical movement of the ball with respect to the touchpad surface as it moves across the touchpad surface.

Preferably the material of the arm 32 acts as a spring to contact the ball against the touchpad surface 20 with sufficient force to be registered by the touchpad electronics while allowing the ball to ride easily on the surface to compensate for any tilt of the touchpad surface relative to the cover plate 22 or for any unevenness of the touchpad surface. The material of the ball may be nylon, Delrin (a proprietary material manufactured by E.I. DuPont de Nemours and Company of Wilmington, Del.) or the like that has an essentially frictionless surface but is hard enough to withstand wear without eroding the touchpad surface.

Thus the present invention provides a touchpad jogger for emulating the motion and feel of a mechanical potentiometer jogger by rotatably attaching an essentially frictionless ball at the cantilever end of a spring arm fixedly attached to an axle so that rotational movement of a knob attached to the axle causes the ball to traverse the surface of the touchpad in emulation of an operator's circular contact with the touchpad surface.

What is claimed is:

1. An apparatus for emulating operator contact on a touchpad surface comprising:
    means for contacting the touchpad surface;
    an axle;
    means for fixedly coupling the contacting means to one end of the axle, the contacting means being rotatably mounted on the coupling means, so that when the axle is rotated the contacting means rolls across the touchpad surface to emulate operator contact; and
    means for rotating the axle.

2. An apparatus as recited in claim 1 wherein the coupling means comprises:
    an arm cantilever mounted at one end of the axle; and
    means for rotatably mounting the contacting means at the other end of the arm.

3. An apparatus as recited in claim 2 wherein the arm comprises a spring wire of a material to allow the contacting means to follow the contours of the touchpad surface as the contacting means rolls across the touchpad surface without exerting excessive force against the touchpad surface.

4. An apparatus as recited in claim 1 wherein the contacting means comprises an essentially frictionless ball rotatably mounted on the coupling means.

5. An apparatus as recited in claim 2 wherein the contacting means comprises an essentially frictionless ball rotatably mounted on the coupling means.

6. An apparatus as recitred in claim 5 wherein the contacting means further comprises a pair of spacers rotatably mounted on the arm bracketing the ball.

7. An apparatus as recited in claim 1 wherein the rotating means comprises a knob fixedly attached to the other end of the axle.

8. An apparatus as recited in claim 1 further comprising a plate for attachment to a housing containing the touchpad surface, the plate when attached to the housing being essentially parallel to the touchpad surface and having a central aperture through which the axle extends, the coupling means being fixed to the end of the axle on the side of the plate adjacent the touchpad surface.

* * * * *